United States Patent

Achari et al.

[11] Patent Number: 6,019,910
[45] Date of Patent: Feb. 1, 2000

[54] ETCHING TRI-METAL LAYERS TO FORM ELECTRONIC CIRCUITS USING AQUEOUS ALKALINE SOLUTIONS INCLUDING NITRATES

[75] Inventors: Achyuta Achari, Canton; Delin Li, Dearborn Heights, both of Mich.

[73] Assignee: Ford Motor Company, Dearborn, Mich.

[21] Appl. No.: 08/995,449

[22] Filed: Dec. 22, 1997

[51] Int. Cl.$^7$ ..................................................... C09K 13/02
[52] U.S. Cl. .......................................... 252/79.5; 216/102
[58] Field of Search ........................... 252/79.5; 216/102

[56] References Cited

U.S. PATENT DOCUMENTS

| | | |
|---|---|---|
| 3,957,553 | 5/1976 | Smith . |
| 4,349,411 | 9/1982 | Okinaka ..................................... 216/22 |
| 4,417,949 | 11/1983 | Lindner et al. . |
| 4,588,474 | 5/1986 | Gross . |
| 5,091,046 | 2/1992 | Hohn . |

FOREIGN PATENT DOCUMENTS

| | | |
|---|---|---|
| 691 281 | 5/1967 | Belgium . |
| 233 592 | 3/1986 | German Dem. Rep. . |
| 34 05 437 | 10/1984 | Germany . |

*Primary Examiner*—Randy Gulakowski
*Assistant Examiner*—Shamim Ahmed
*Attorney, Agent, or Firm*—Lorraine S Melotik

[57] ABSTRACT

The invention is an aluminum etchant and method for chemically milling aluminum, according to one embodiment, from a copper-aluminum-copper tri-metal layer to form electronic circuits. The tri-metal comprises copper circuit patterns present on opposing surfaces of an aluminum foil, one of the copper patterns being laminated on a substrate. The etchant comprises an aqueous solution of 50 to 500 g/l base selected from (a) sodium hydroxide, (b) potassium hydroxide, and (c) their mixture; and 60 to 500 g/l nitrate salt. The method comprises contacting the tri-metal with the etchant at a temperature between 25 and 95° C. for a time sufficient to remove a desired amount of the aluminum layer and provide electronic circuitry (rigid/flexible/3-dimensional circuitry) which contains multiple conductive circuit layers.

5 Claims, 2 Drawing Sheets

ETCHING TRI-METAL LAYERS TO FORM ELECTRONIC CIRCUITS USING AQUEOUS ALKALINE SOLUTIONS INCLUDING NITRATES

Reference is made to related U.S. patent application Ser. No. 08/996,007 filed Dec. 22, 1997 and entitled "ETCHING OF AL—CU LAYERS TO FORM ELECTRONIC CIRCUITS USING BASIC SOLUTIONS INCLUDING NITRITES, BORATES OR BROMATES", being commonly assigned herewith.

FIELD OF THE INVENTION

The present invention relates to an etchant and a method for chemically milling circuit boards (rigid/flexible or 3-dimensional circuitry) comprising copper on aluminum foil laminated to a substrate using an alkaline aqueous solution containing nitrate salts to selectively etch out the aluminum.

BACKGROUND OF THE INVENTION

It has been suggested that the complexity and weight of electronic component designs in automotive vehicles can be improved by assembling the electronic components on substrates, e.g., on the underside of vehicle dashboards. This type of system has been termed Instrument Panel (IP) Super-Integration. In this system, it is intended that individual electronic circuit boards be first assembled on substrates, with electronic components attached thereupon. Currently used conventional printed circuit board technologies utilize either additively or subtractively defined copper, a dielectric laminate and plated through hole for interconnection. One of the drawbacks of this method is that it is expensive.

Another way is being explored by the inventors to provide three-dimensional circuits for use as part of Super-Integration Systems. It involves forming interconnected electronic substrates through the preferential chemical etching of a tri-metal layer of dissimilar metals. That is, copper patterned circuit images are carried on both sides of an aluminum foil. This copper-aluminum-copper tri-metal system could be made by cladding, lamination, or plating of copper followed by selective etch of copper to form the copper patterns on both sides of the aluminum foil. After the tri-metal is laminated on a polymeric substrate as by means of an adhesive, it needs to be selectively etched to remove the aluminum and form an electronic circuit board. Alternately, copper patterns could be selected electroplated on both sides of an aluminum foil, with or without a seed layer, and then after lamination of one of the copper patterns on a substrate, the aluminum would be selectively etched away to form an electronic circuit board. One of the advantages of this Cu—Al—Cu construction is the ability to have higher density circuit patterns by providing cross-overs of Cu-tracks. In addition, this new technique is seen capable of providing better heat dissipation through the aluminum interlayer.

In order to obtain the desired circuit pattern of such a Cu—Al—Cu construction, the aluminum needs to be selectively etched away. To provide durable circuits, it is necessary to control the etching of the aluminum carefully to have an optimum undercut. Sodium hydroxide solutions have been long used to etch aluminum. Attempts at etching the tri-metal Cu—Al—Cu described above with a conventional sodium hydroxide solution was found by the inventors, however, to result in an unacceptably large degree of undercutting of the aluminum as shown in FIG. 1. This is believed by the inventors to be based on the difference in electrochemical potential between aluminum and copper which unfavorably enhances aluminum etching rates in areas adjacent to the copper in this solution. The undercut of the aluminum was found to be so high, that the copper pads are lifted. We have now unexpectedly found a way to overcome the high undercut problems associated with such chemical etching of aluminum for tri-metal Cu—Al—Cu laminates which manufactures durable chemically milled circuits. This process involves, according to one embodiment, the selective etching of the tri-metal with a particularly defined alkaline etchant solution of sodium or potassium hydroxide which includes defined amounts of nitrates at a given temperature.

Several patents were identified after invention which disclose etchants for preparing aluminum surfaces. U.S. Pat. No. 3,957,553 discloses an alkaline etching bath for aluminum to improve its appearance and prepare it for subsequent treatment. The bath comprises an alkali metal hydroxide (15–200 g/l), a chelating agent (0.5–15 g/l) like sorbitol for suppressing alumina precipitation during etching, and an oxidizing agent (0.0001–1 g/l) such as nitrates or nitrites. U.S. Pat. No. 5,091,046 discloses a process for caustic etching of aluminum to obtain a matte finish with a solution containing free sodium hydroxide and dissolved aluminum in a 0.6–2.1 g/l ratio and an etch equalizing agent at a temperature above about 70° C. The latter patent discloses total sodium hydroxide concentrations of 40–120 g/l, nitrate up to 50 g/l and nitrite up to 20 g/l. These etching solutions have the drawbacks that they would have an undesirable low etching rate with the Cu—Al—Cu tri-metals when the temperature is below 55° C. and would attack plastic at temperatures above 65° C. It would be desirable to have an etching solution and method for etching the aluminum from copper-aluminum laminates which would selectively etch out a portion of the aluminum while leaving sufficient aluminum to provide a structurally sound circuits, such as 3-dimentional circuits. And the etching should take place at a commercially acceptable rate. The present invention provides such an etchant and method of etching out the aluminum.

DISCLOSURE OF THE INVENTION

The invention is an etchant and method for selectively etching aluminum from, according to one embodiment, copper-aluminum-copper tri-metal layers which comprise copper circuit patterns present on opposing surfaces of an aluminum foil, one of the copper patterns being laminated onto a substrate. The etchant comprises an aqueous solution of: (1) 60 to 500 g/l base selected from (a) sodium hydroxide, (b) potassium hydroxide, and (c) their mixture; and (2) 70 to 500 g/l of a nitrate salt. According to one embodiment of the method, the tri-metal laminate is contacted with the etchant disclosed above at a temperature of 25 and 95° C. and for a time sufficient to selectively remove a desired amount of the aluminum layer and form electronic circuitry with contains multiple conductive copper circuit layers.

Advantageously, the present invention etchant and method provides for fast and uniform etching of the multiple layer Cu—Al—Cu circuits disclosed above. In addition, the present invention etchant can be used to etch aluminum foil provided with a layer of copper circuitry, as disclosed herein for patterning the aluminum foil in the tri-metal, the aluminum in the copper-aluminum embodiment being laminated to a substrate. The present invention etchant solution has an etch rate almost twice as fast as conventional sodium hydroxide etchants which results in lower manufacturing costs, while at the same time avoids causing the undesirable undercutting of the copper layer as was the case with conventional sodium hydroxide etchants. The optimal ratio of the downward cut to horizontal cut during etching is about 1:1 which generally takes place in the present invention method as shown in FIG. 2.

Further we have advantageously found that the etchant solutions of the present invention leave the copper surfaces clean, i.e., they are not oxidized or corroded, thus eliminating the need for a follow-up cleaning process. In addition, preferred invention etchant solutions disclosed herein containing sodium hydroxide and sodium nitrate are relatively inexpensive, readily available, and easily treated and disposed of which enhances the advantage of the present invention method using this new etchant. This new invention technology, which has been termed Etchted Tri-Metal (ETM), is considered to optimal for use in the Super Integration of interior automotive subsystems.

DETAILED DESCRIPTION OF PREFERRED EMBODIMENTS

Figure 1:
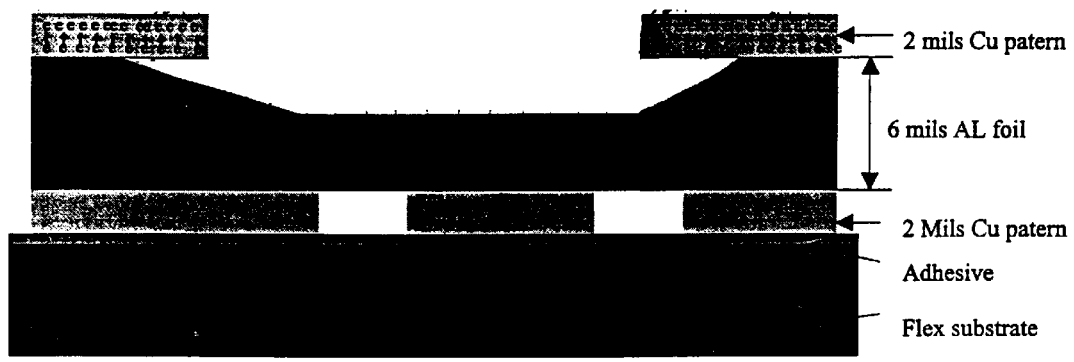
FIG. 1 is a schematic of a comparative example etching of a tri-metal of copper patterned on two sides or aluminum foil and adhered to a substrate etched in an aqueous NaOH solution.

The inventors have unexpectedly found a novel and commercially desirable way to manufacture multiple layer circuits adhered to a substrate. As disclosed above, the method is carried out by selectively etching aluminum from a tri-metal of copper-aluminum-copper (or a bi-metal) with a novel etchant solution which avoids causing any serious undercut problems. In the present invention ETM method, one embodiment comprises etching the aluminum from an aluminum foil where copper circuits have been provided on opposing surfaces of the aluminum foil.

As discussed above, we found that etching aluminum when it adjoins a metal of different potential, like copper, can be problematic. That is, using a conventional sodium hydroxide etching solution causes serious undercut problems when too much of the aluminum is removed underneath the copper circuits. We have found that by adding nitrate salts to the aqueous alkaline solution in specified amounts and using the etchant solution as a chosen temperature, these undercut problems are significantly minimized while providing faster etching. We believe that this problem of undercutting is tied to the evolution of $NH_3$ gas at the copper/aluminum interface during etching. We theorize that the agitation produced at the interface by the gas evolution results in undesirable undercut. We found that by adding nitrate salts to the bath in specific amounts and having the etching solution at a given temperature, the gas evolution is reduced and the aluminum undercutting is significantly lessened. That is the aluminum etching laterally is lessened while increasing the etching of the aluminum in the vertical direction. Neither the validity nor the understanding of this theory, however, is necessary for the practice of the present invention method.

The copper-aluminum-copper layers being chemically milled according to one preferred embodiment of the present invention are made of an aluminum foil populated with copper patterns on the both sides of the aluminum foil, one of the copper patterns being laminated on a substrate. As discussed above, however, this method and etchant can be used for milling aluminum from copper-aluminum layers laminated to a substrate. The way in which this tri-metal or bi-metal is made is not critical to the present invention. One way to make this copper-aluminum-copper tri-metal is by first depositing and developing a photo-resist on both sides of a copper-aluminum-copper foil as could be made by cladding, lamination, or plating. This then could be followed by selectively etching the copper to form copper patterns on both sides of the aluminum foil. Thereafter, before etching out the aluminum to form the three-dimensional circuits, one of the copper patterns is laminated on substrate as by using an adhesive. Another method to make this tri-metal of copper-aluminum-copper using a photo-resist image on both sides of an aluminum foil, with or without a seed layer of other metal, followed by selectively electroplating copper patterns on both sides of the aluminum foil. Then the photo-resist would be removed and one of the copper patterns laminated on a substrate to form a tri-metals of copper-aluminum-copper for aluminum etching. The embodiment of bi-metal copper patterned on one side of aluminum foil could be similarly made as would be apparent to one skilled in the art in view of the present disclosure. The substrate can be, for example, a polymeric material like plastic, FR-4 (fiber reinforced resin), or a metal with a coating of a plastic. Neither the particular design of the circuitry on the aluminum foil nor the method by which it is produced, nor the particular substrate to which it is laminated, however, is critical to the practice of the invention etching method.

Figure 2:
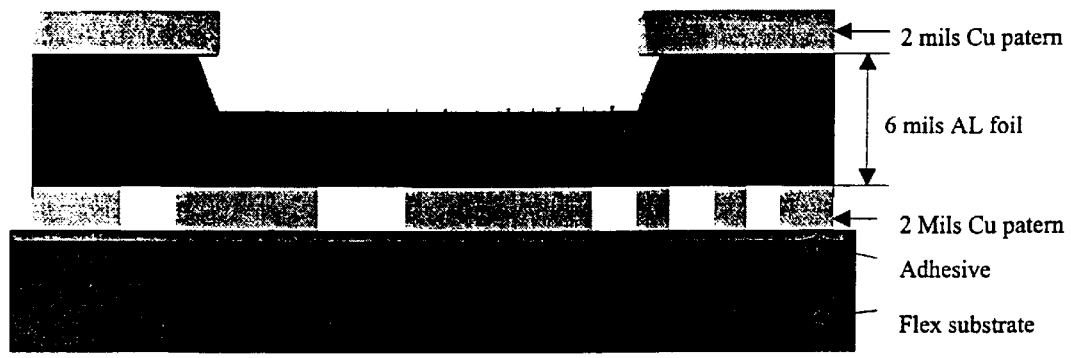
FIG. 2 is a schematic of an example of etching a tri-metal according to embodiments of the present invention using an aqueous alkaline solution of nitrate salts.
Figure 3:
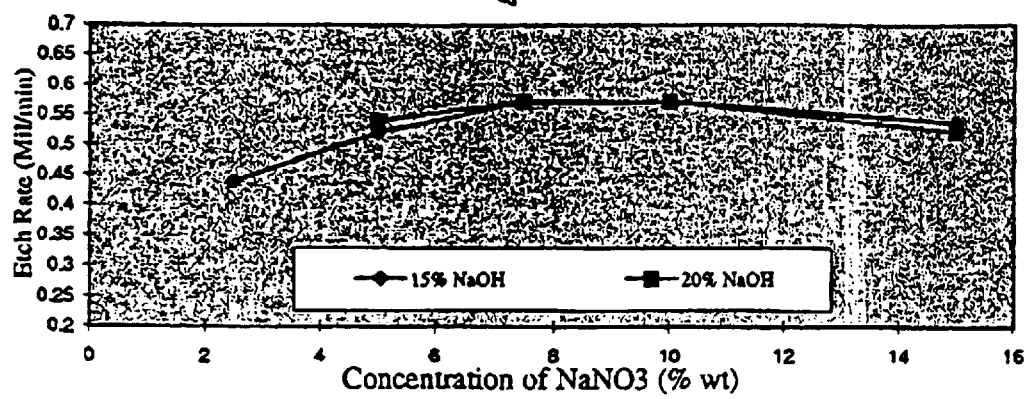
FIG. 3 is a graph showing the etch rate of aluminum in a tri-metal based on the nitrate concentration and base concentration.

The solution used herein comprises an aqueous etching solution containing 60 to 500 g/l base selected from (a) sodium hydroxide, (b) potassium hydroxide, and (c) their mixture and nitrates. Preferably, the base concentration is 150 to 250 g/l. The base is preferably sodium hydroxide. The optimal concentration of base and nitrate in the invention etchant depends on several factors including desired etching rate and undercut. For example, the etching rate is increased when the concentration of sodium hydroxide is lower than 150 g/l or more than 250 g/l as shown in FIG. 3. However, as shown in FIG. 2, the etching rate is stable when the sodium hydroxide from 150 g/l to 250 g/l.

Figure 4:
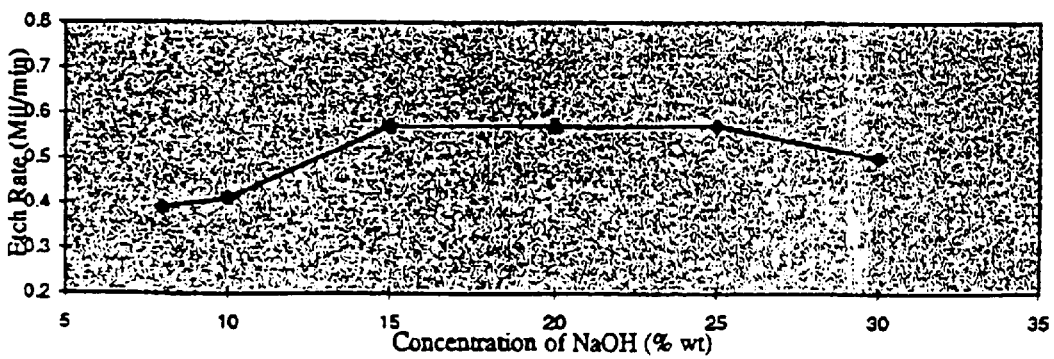
FIG. 4 is a graph showing etch rate of aluminum in a tri-metal based on the change in sodium hydroxide concentration.

The solution also contains a nitrate salt or mixture of nitrate salts. The nitrate salt is included in 70 to 500 g/l, more preferably being 70 to 150 g/l. A relationship between etching rate and the concentration of sodium nitrate is shown in FIG. 4. It can be seen from FIG. 4 that the etching rate is decreased when the sodium nitrate is lower than 70 g/l and more than 150 g/l. The nitrate salt when used in these amounts was unexpectedly found to allow the uniform etching of the aluminum from the tri-metal to maintain the integrity of the final electronic circuitry as explained above. The nitrate salt dissolved in the etching solution may be any nitrate salt including, but not limited to, such salts of metals like sodium, potassium, iron (e.g., ferric nitrate), manganese, zinc, lithium, silver, calcium, ammonium, cobalt (e.g., cobaltous nitrate), copper (e.g., cupric nitrate), aluminum, mercury (e.g., mercuric nitrate), thorium, barium, guanidine, lead, cerium, bismuth, zirconium, strontium, cadmium, lanthanum, nickel (e.g., nicklous nitrate), and mixtures of any of them. The particularly preferred nitrates are those of sodium and potassium because both of them have lower cost relative other nitrates.

Figure 5:
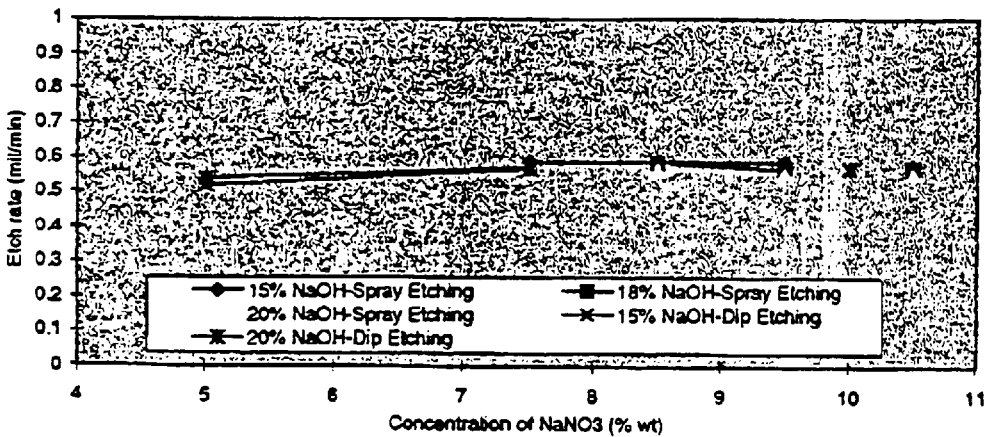
FIG. 5 is a graph showing differences in etch rate based on changing sodium hydroxide concentrations, nitrate concentration, and spray and dip etching.

The alkaline aqueous aluminum etchant solution of the present invention can be used to etch aluminum by any convenient method, including dip etching and spray etching. The etching rate is almost the same using either dip or spray etching as shown in FIG. 5.

To form the etchant solution, the nitrate salt generally would be added into the alkaline aqueous solution at room temperature or at an elevated temperature which facilitates dissolution. Tri-metal layers of copper-aluminum-copper (or coper-aluminum layers, as disclosed herein, are then contacted with the etchant solution for a time sufficient to etch out the aluminum in the desired amount. The etchant solution is at a temperature of 25 to 95° C., more preferably being 40 to 65° C., most preferably being 45 to 55 C. Selection of optimal base, nitrates and their concentration, as well as etchant temperature and etch time, would be within the skill of one in the art in view of the present disclosure. Factors to be taken in consideration in choosing the etchant temperature include, e.g., desired etching rate, desired undercut, and the propensity of the etchant to attack the adhesive or substrate. The aluminum concentration in the etchant solution can be varied to optimize etching rate and undercut as would be apparent to one skilled in the art in view of the present disclosure.

Table 1 shows that the change of the aluminum undercut with the concentration of sodium nitrate and sodium hydroxide in the alkaline aqueous solution of sodium nitrate. Aluminum undercut is high and unacceptable at low (2.5%) nitrate concentration. Examples 1–8 and 14–20 show the etching rate (time to remove 6 mils thick aluminum) with concentration of sodium nitrate at different concentrations of sodium hydroxide. It can be learned from these examples that the etching rate is low when sodium nitrate concentration is low (2.5%) or high (20–40%). Examples 9–13 show the etching rate (time to remove 6 mils aluminum) with concentration of sodium hydroxide at 7.5 wt % sodium nitrate. These examples suggest that etching rate is low when sodium hydroxide concentration is low (10%) Examples 21–27 show the etching rate in the different alkaline nitrate salt solutions indicating fast etching rates with these solutions also.

TABLE 1

| Solution | Temp. (° C.) | Average undercut (mil) |
|---|---|---|
| 2.5 wt % NaNO3 + 15% wt NaOH | 55 | 5.7 |
| 5.0 wt % NaNO3 + 15% wt NaOH | 55 | 4.8 |
| 7.5 wt % NaNO3 + 15% wt NaOH | 55 | 4.9 |
| 10 wt % NaNO3 + 15% wt NaOH | 55 | 5.3 |
| 7.5 wt % NaNO3 + 10% wt NaOH | 55 | 6.8 |
| 7.0 wt % NaNO3 + 20% wt NaOH | 55 | 5.5 |
| 7.5 wt % NaNO3 + 25% wt NaOH | 55 | 5.0 |
| 7.5 wt % NaNO3 + 30% wt NaOH | 55 | 5.0 |

| Example | Etchant | Temperature (° C.) | Time* |
|---|---|---|---|

TABLE 1-continued

| | EXAMPLES 1–4 | | |
|---|---|---|---|
| 1 | 2.5 wt % NaNO3 + 15% wt NaOH | 55 | 13.5 |
| 2 | 5.0 wt % NaNO3 + 15% wt NaOH | 55 | 11.5 |
| 3 | 7.5 wt % NaNO3 + 15% wt NaOH | 55 | 10.5 |
| 4 | 10 wt % NaNO3 + 15% wt NaOH | 55 | 10.5 |
| | EXAMPLES 5–8 | | |
| 5 | 5.0 wt % NaNO3 + 20 % wt NaOH | 55 | 11.0 |
| 6 | 7.5 wt % NaNO3 + 20 % wt NaOH | 55 | 10.5 |
| 7 | 10 wt % NaNO3 + 20 % wt NaOH | 55 | 10.5 |
| 8 | 15 wt % NaNO3 + 20 % wt NaOH | 55 | 11.5 |
| | EXAMPLES 9–13 | | |
| 9 | 7.5 wt % NaNO3 + 10% wt NaOH | 55 | 14.5 |
| 10 | 7.5 wt % NaNO3 + 15% wt NaOH | 55 | 10.5 |
| 11 | 7.5 wt % NaNO3 + 20% wt NaOH | 55 | 10.5 |
| 12 | 7.5 wt % NaNO3 + 25% wt NaOH | 55 | 10.5 |
| 13 | 7.5 wt % NaNO3 + 30% wt NaOH | 55 | 12.0 |
| | EXAMPLES 14–20 | | |
| 14 | 20 wt % NaNO3 + 8% wt NaOH | 55 | 20 |
| 15 | 30 wt % NaNO3 + 8% wt NaOH | 55 | 25 |
| 16 | 35 wt % NaNO3 + 8% wt NaOH | 55 | 21 |
| 17 | 40 wt % NaNO3 + 8% wt NaOH | 55 | 24 |
| 18 | 40 wt % NaNO3 + 10% wt NaOH | 55 | 24 |
| 19 | 40 wt % NaNO3 + 15% wt NaOH | 55 | 21 |
| 20 | 40 wt % NaNO3 + 20% wt NaOH | 55 | 22 |
| | EXAMPLE 21–22 | | |
| 21 | 7.5 wt % NaNO3 + 15% wt KOH | 55 | 12 |
| 22 | 7.5 wt % NaNO3 + 0.5% KNO3 + 15% wt KOH | 55 | 12 |
| | EXAMPLES 23–27 | | |
| 23 | 5.0 wt % Fe(NO3)3 + 15% wt NaOH | 55 | 11.5 |
| 24 | 5.0 wt % Mg(NO3)2 + 15% wt NaOH | 55 | 10.5 |
| 25 | 5.0 wt % Cr(NO3)3 + 15% wt NaOH | 55 | 15.0 |
| 26 | 7.5 wt % KNO3 + 15% wt NaOH | 55 | 15.5 |
| 27 | 7.5 wt % CoNO3 + 15% wt NaOH | 55 | 14.5 |

*to dissolve 6 mils Al (min) - in all examples

We claim:

1. An etchant useful for chemically milling aluminum from tri-metal layers of copper-aluminum-copper being copper circuit patterns present on opposing surfaces of an aluminum foil, one of the copper patterns being laminated onto a substrate, the etchant comprising an aqueous solution of: (1) 60–500 g/l base selected from the group consisting of (a) sodium hydroxide, (b) potassium hydroxide, and (c) their mixture; and (2) 91.3–150 g/l of a nitrate salt, wherein the etchant is at a temperature of 40–65° C.

2. The etchant according to claim 1 wherein said nitrate is a salt of a metal selected from the group consisting of sodium, potassium, iron, manganese, zinc, lithium, silver, calcium, ammonium, cobalt, copper, aluminum, mercury, thorium, barium, guanidine, lead, cerium, bismuth, zirconium, strontium, cadmium, lanthanum, nickel, and mixtures of any of them.

3. The etchant according to claim 1 wherein said etchant is used for the dip etching or spray etching of the aluminum.

4. The etchant according to claim 1 wherein said base comprises 150 to 250 g/l.

5. An etchant for chemically milling aluminum from a copper-aluminum-copper tri-metal layers, one of the copper layers being laminated on a substrate, the etchant comprising an aqueous solution of: (1) 150 to 250 g/l base selected from the group consisting of (a) sodium hydroxide, (b) potassium hydroxide, and (c) their mixture; and (2) 91.3 to 150 g/l of a nitrate salt at a temperature of 40 to 65° C.

* * * * *